(12) United States Patent
Inoue

(10) Patent No.: US 11,742,827 B2
(45) Date of Patent: Aug. 29, 2023

(54) ELASTIC WAVE DEVICE

(71) Applicant: Murata Manufacturing Co., Ltd., Nagaokakyo (JP)

(72) Inventor: Kazunori Inoue, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 0 days.

(21) Appl. No.: 17/964,370

(22) Filed: Oct. 12, 2022

(65) Prior Publication Data

US 2023/0035609 A1 Feb. 2, 2023

Related U.S. Application Data

(63) Continuation of application No. PCT/US2021/029675, filed on Apr. 28, 2021.

(60) Provisional application No. 63/017,100, filed on Apr. 29, 2020.

(51) Int. Cl.
*H03H 9/02* (2006.01)
*H03H 9/145* (2006.01)

(52) U.S. Cl.
CPC ...... *H03H 9/02559* (2013.01); *H03H 9/02228* (2013.01); *H03H 9/02992* (2013.01); *H03H 9/14541* (2013.01)

(58) Field of Classification Search
CPC .......... H03H 9/02559; H03H 9/02228; H03H 9/02992; H03H 9/14541
USPC ...... 310/313 R, 313 A, 313 B, 313 C, 313 D
See application file for complete search history.

(56) References Cited

U.S. PATENT DOCUMENTS

| | | |
|---|---|---|
| 2014/0009032 A1 | 1/2014 | Takahashi et al. |
| 2016/0204760 A1 | 7/2016 | Kon et al. |
| 2017/0214384 A1 | 7/2017 | Bhattacharjee |
| 2017/0250671 A1 | 8/2017 | Omura et al. |
| 2018/0269852 A1 | 9/2018 | Daimon et al. |
| 2019/0386638 A1 | 12/2019 | Kimura et al. |

FOREIGN PATENT DOCUMENTS

| | | |
|---|---|---|
| CN | 103532513 A | 1/2014 |
| JP | 2012-257019 A | 12/2012 |
| WO | 2017/110586 A1 | 6/2017 |

OTHER PUBLICATIONS

First Office Action in CN202180030021.6, mailed Feb. 4, 2023, 9 pages.
Official Communication issued in International Patent Application No. PCT/US2021/029675, mailed on Aug. 5, 2021.

*Primary Examiner* — Derek J Rosenau
(74) *Attorney, Agent, or Firm* — KEATING & BENNETT, LLP

(57) ABSTRACT

An elastic wave device includes a piezoelectric film laminated on a first main surface of a support substrate including a recessed portion open to a first main surface. A cavity portion including the recessed portion is defined by the support substrate and the piezoelectric film. An electrode is on the piezoelectric film. The electrode includes first and second bus bars, a first electrode finger connected to the first bus bar, and a second electrode finger connected to the second bus bar. The first and second bus bars include corner portions inside the cavity portion when viewed in plan view. A curved portion as a pressure relaxation portion to relax pressure on the piezoelectric film at at least one of the corner portions of the first and second bus bars is provided between the corner portion and an outer edge of the cavity portion.

20 Claims, 6 Drawing Sheets

ELASTIC WAVE DEVICE

CROSS REFERENCE TO RELATED APPLICATIONS

This application claims the benefit of priority to U.S. Pat. Application No. 63/017,100, filed on Apr. 29, 2020, and is a Continuation Application of PCT Application No. PCT/US2021/029675, filed on Apr. 28, 2021. The entire contents of each application are hereby incorporated herein by reference.

BACKGROUND OF THE INVENTION

1. Field of the Invention

The present invention relates to an elastic wave device including a cavity portion below a piezoelectric film.

2. Description of the Related Art

Conventionally, an elastic wave device using a plate wave propagating in a piezoelectric film made of $LiNbO_3$ or $LiTaO_3$ is known. For example, Japanese Patent Application Laid-Open No. 2012-257019 discloses an elastic wave device using a Lamb wave as a plate wave. Here, a piezoelectric substrate is provided on a support. A cavity portion is provided in the support, that is, a support substrate. The piezoelectric substrate overlaps the cavity portion. The piezoelectric substrate is made of $LiNbO_3$ or $LiTaO_3$. An IDT electrode is provided on the upper surface of the piezoelectric substrate. A voltage is applied between a plurality of electrode fingers connected to one potential of the IDT electrode and a plurality of electrode fingers connected to another potential of the IDT electrode. Thus, the Lamb wave is excited. Reflectors are provided on both sides of the IDT electrode. Thus, an elastic wave resonator using a plate wave is provided.

In order to reduce the size of the elastic wave device, it is conceivable to reduce the number of electrode fingers. However, when the number of electrode fingers is reduced, the Q value is reduced.

Further, in the elastic wave device including the cavity portion as described in Japanese Patent Application Laid-Open No. 2012-257019, when a portion of the bus bar of the IDT electrode is located above the cavity portion, cracks may occur in the piezoelectric film at the corner portion of the bus bar.

SUMMARY OF THE INVENTION

Preferred embodiments of the present invention provide elastic wave devices that are each able to increase the Q value and reduce or prevent cracks in a piezoelectric film even when the size of the elastic wave device is reduced.

According to a preferred embodiment of the present invention, an elastic wave device includes a support substrate including a first main surface and a recessed portion open to the first main surface, a piezoelectric film made of lithium niobate or lithium tantalate, which is laminated on the first main surface of the support substrate and defines a cavity portion with the recessed portion and the support substrate, and an electrode on the piezoelectric film and including first and second bus bars, a first electrode finger connected to the first bus bar, and a second electrode finger connected to the second bus bar. The first and second bus bars include a plurality of corner portions inside the cavity portion when viewed in plan view. The elastic wave device uses a bulk wave in a thickness slip mode. A pressure relaxation portion to relax pressure on the piezoelectric film at at least one of the corner portions of the first and second bus bars is provided between the corner portion and an outer edge of the cavity portion.

According to a preferred embodiment of the present invention, an elastic wave device includes a support substrate including a first main surface and a recessed portion open to the first main surface, a piezoelectric film made of lithium niobate or lithium tantalate, which is laminated on the first main surface of the support substrate and defines a cavity portion with the recessed portion and the support substrate, and an electrode on the piezoelectric film and including first and second bus bars, a first electrode finger connected to the first bus bar, and a second electrode finger connected to the second bus bar. The first and second bus bars include a plurality of corner portions inside the cavity portion when viewed in plan view. When a thickness of the piezoelectric film is d and a distance between centers of the adjacent first electrode finger and second electrode finger is p, d/p is about 0.5 or less. A pressure relaxation portion to relax pressure on the piezoelectric film at at least one of the corner portions of the first and second bus bars is provided between the corner portion and an outer edge of the cavity portion.

According to preferred embodiments of the present invention, it is possible to provide elastic wave devices that are each able to increase the Q value and reduce or prevent cracks in the piezoelectric film even when the size of the elastic wave devices is reduced.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, the present invention will be described by explaining preferred embodiments of the present invention with reference to the drawings.

Each of the preferred embodiments described herein is exemplary and that partial substitutions or combinations of configurations are possible between different preferred embodiments.

First Preferred Embodiment

Figure 1:
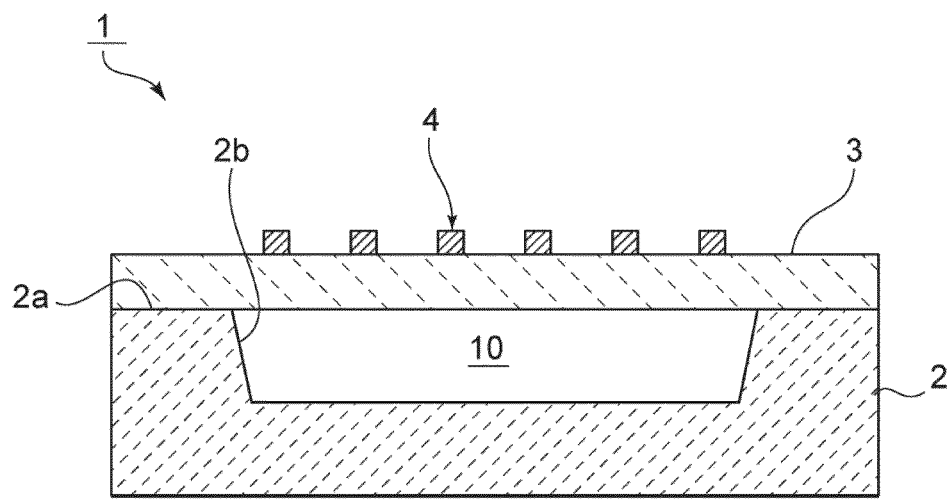
FIG. 1 is a front sectional view of an elastic wave device according to a first preferred embodiment of the present invention.
Figure 2:
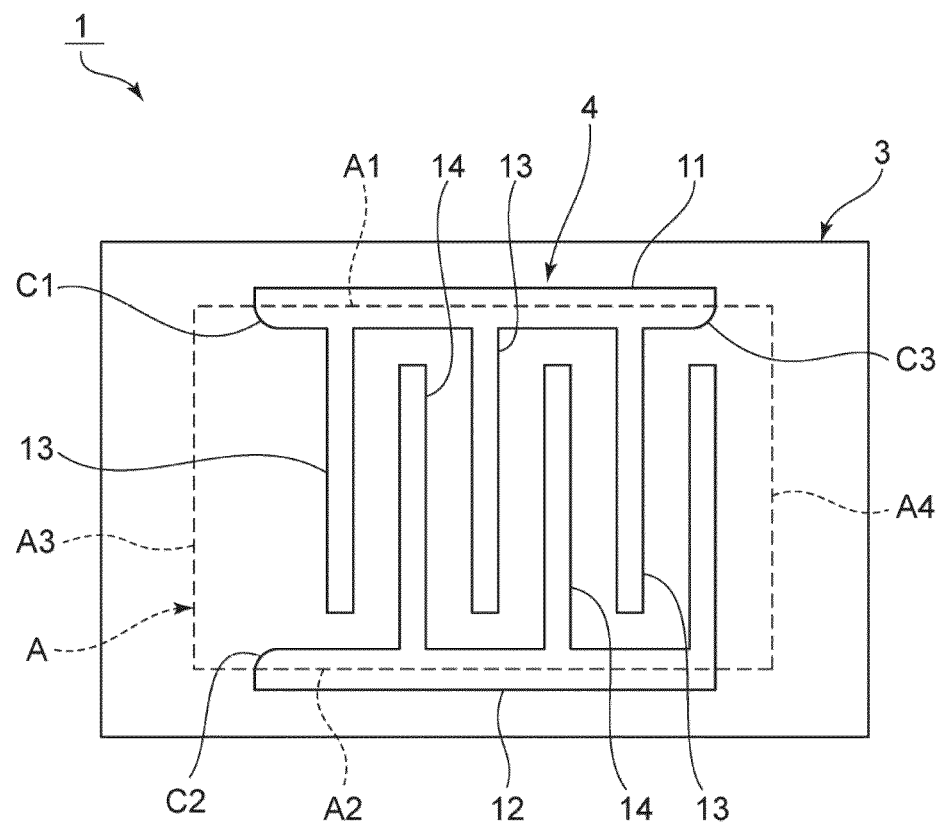
FIG. 2 is a plan view of the elastic wave device according to the first preferred embodiment of the present invention.

FIG. 1 is a front sectional view of an elastic wave device according to a first preferred embodiment of the present invention, and FIG. 2 is a plan view thereof. An elastic wave device 1 includes a support substrate 2, a piezoelectric film 3, and an electrode 4. The piezoelectric film 3 is provided on the support substrate 2. The electrode 4 is provided on the piezoelectric film 3.

A recessed portion 2b is provided on a first main surface 2a of the support substrate 2. The recessed portion 2b is closed by the piezoelectric film 3, and the portion at which the recessed portion 2b is provided is a cavity portion 10. The cavity portion 10 may penetrate through the support substrate 2.

The support substrate 2 may include a plurality of layers laminated on each other. Specifically, for example, the support substrate 2 may include a support layer and an intermediate layer laminated on the support layer. In this case, the recessed portion may be provided on a main surface opposite to the support layer side of the intermediate layer, which is a first main surface of the support substrate.

The broken line A in FIG. 2 shows the outer peripheral edge of the cavity portion 10. Although not particularly limited, in the present preferred embodiment, the opening shape of the recessed portion 2b, that is, the planar shape of the portion of the cavity portion 10 facing the piezoelectric film 3 is preferably rectangular or substantially rectangular, for example. The outer peripheral edge of the cavity portion 10 includes first and second sides A1 and A2 extending in the direction orthogonal or substantially orthogonal to the extending direction of first and second electrode fingers 13 and 14, and third and fourth sides A3 and A4 extending in the extending direction of the first and second electrode fingers 13 and 14.

The electrode 4 incudes a first bus bar 11 and a second bus bar 12. One end of at least one first electrode finger 13 is connected to the first bus bar 11. One end of at least one second electrode finger 14 is connected to the second bus bar 12.

Although the electrode 4 is preferably an interdigital transducer (IDT) electrode in the present preferred embodiment, it may include a pair of first and second electrode fingers, for example.

In the elastic wave device 1, by applying an AC voltage between the first electrode fingers 13 and the second electrode fingers 14, vibration of a thickness slip mode described later is excited as an elastic wave. In order not to interfere with this vibration, the cavity portion 10 is provided below the piezoelectric film 3.

However, in the elastic wave device 1 including the cavity portion 10, corner portions of the first and second bus bars 11 and 12 may be located inside the cavity portion 10 in plan view. In that case, the pressure is concentrated on the piezoelectric film at the corner portions, and cracks may occur. This will be described with reference to FIG. 6.

Figure 6:
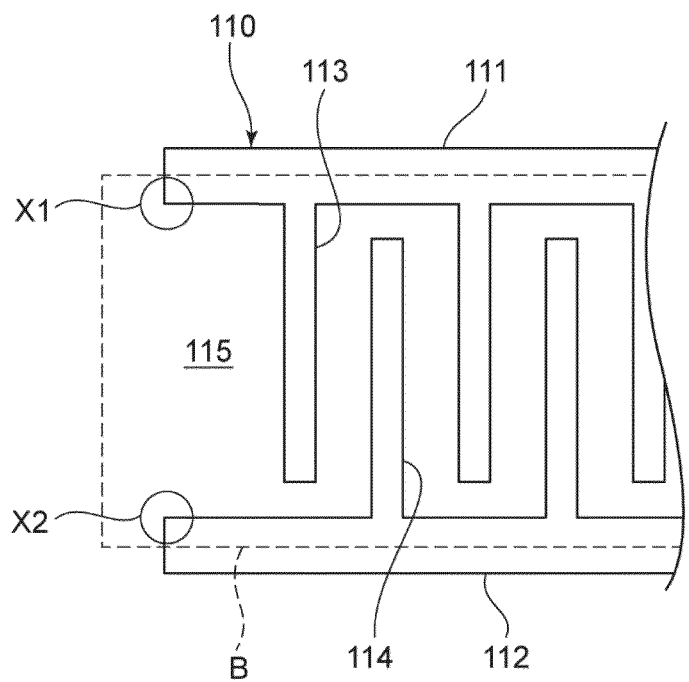
FIG. 6 is a partially cutaway plan view explaining a problem of a conventional elastic wave device.

FIG. 6 is a partially cutaway plan view explaining a problem of a conventional elastic wave device.

In an IDT electrode 110, one ends of first electrode fingers 113 and second electrode fingers 114 are connected to a first bus bar 111 and a second bus bar 112, respectively. The IDT electrode 110 is provided on a piezoelectric film 115, and a cavity portion is provided below the piezoelectric film 115. The broken line B in FIG. 6 shows the outer peripheral edge of the cavity portion when viewed in a plan view. Here, the first bus bar 111 and the second bus bar 112 include corner portions surrounded by the circles X1 and X2 (portions where the circumscribed lines of the bus bar intersect each other at the end portion of the bus bar in a plan view). When viewed in a plan view, these corner portions are located inside the cavity portion.

Meanwhile, the first and second bus bars 111 and 112 are provided on the piezoelectric film 115, but are physically coupled to the support substrate. In such a structure, when the piezoelectric film 115 covers an opening portion of the support substrate, the piezoelectric film 115 tends to swell on the central portion side with respect to the outer peripheral edge of the cavity portion. Therefore, a large pressure is applied to the piezoelectric film 115 side at the corner portions of the first and second bus bars 111 and 112, and cracks may occur in the piezoelectric film 115.

In the elastic wave device 1 shown in FIG. 2, in order to prevent the cracks, curved portions C1 and C2 are provided at the corner portions of the first and second bus bars 11 and 12 so as to be located inside the cavity portion in plan view. That is, the curved portions C1 and C2 define and function as pressure relaxation portions. Since the curved portions C1 and C2 are provided, the pressure on the piezoelectric film 3 can be reduced at the corner portions. Therefore, cracks in the piezoelectric film 3 are unlikely to occur. In the first bus bar 11, a curved portion C3 is also provided at the end portion opposite to the curved portion C1. As a result, cracks in the piezoelectric film 3 at the curved portion C3 are unlikely to occur.

The curved portions C1, C2, and C3 are not particularly limited as long as the corner portions of the first and second bus bars 11 and 12 are not defined by straight lines that are abutted against each other. However, preferably, the radius of curvature of the curved portions C1, C2, and C3 that are rounded at the corner portions is within the range of about 4 micrometers or more and about 20 micrometers or less, for example. Further, when the curved portions C1, C2, and C3 are fan-shaped, it is preferable that the central angle is about 60 degrees or more and about 270 degrees or less, for example.

In the elastic wave device 1, the pressure relaxation portions are provided, and a vibration mode used in the elastic wave device 1 will be described below.

Incidentally, no reflector is provided on the piezoelectric film 3. The elastic wave device 1 does not require a reflector because the elastic wave device 1 uses a bulk wave in the thickness slip mode.

At the time of driving, an AC voltage is applied between the plurality of first electrode fingers 13 and the plurality of second electrode fingers 14. More specifically, an AC voltage is applied between the first bus bar 11 and the second bus bar 12. As a result, it is possible to obtain resonance characteristics using the bulk wave in the thickness slip mode excited in the piezoelectric film 3. Further, in the elastic wave device 1, when the thickness of the piezoelectric film 3 is d, and the distance between centers of the adjacent first and second electrode fingers 13 and 14 of any of the plurality of pairs of the first and second electrode fingers 13 and 14 is p, d/p is preferably about 0.5 or less, for example. Therefore, the bulk wave in the thickness slip mode is effectively excited, and good resonance characteristics can be obtained. More preferably, d/p is about 0.24 or less, for example, and in that case, better resonance characteristics can be obtained. In a case where the plurality of at least one of the first and second electrode fingers 13 and 14 are provided as in the present preferred embodiment, that is, when the first and second electrode fingers 13 and 14 are regarded as an electrode pair, 1.5 pairs or more of the first and second electrode fingers 13 and 14 are provided, and the distance p between the centers of the adjacent first and second electrode fingers 13 and 14 refers to the average distance of the distances between the centers of the adjacent first and second electrode fingers 13 and 14.

Since the elastic wave device 1 of the present preferred embodiment has the above configuration, the Q value is unlikely to decrease even if the number of the pairs of the first and second electrode fingers 13 and 14 is reduced in order to reduce the size. This is because the elastic wave device 1 is a resonator that does not require reflectors on both sides and has a small propagation loss. Further, the reason why the above reflectors are not required is that the bulk wave in the thickness slip mode is used. The difference between a Lamb wave used in the conventional elastic wave device and the bulk wave in the thickness slip mode will be described with reference to FIGS. 3A and 3B.

Figure 3A:
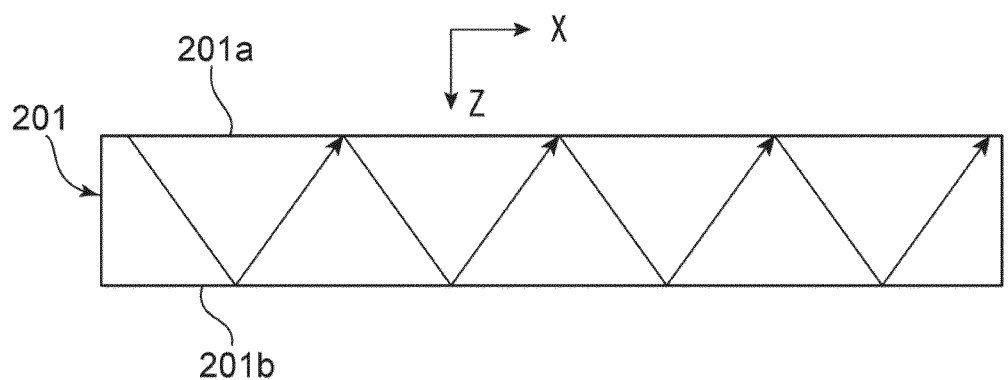
FIG. 3A is a schematic front sectional view explaining a Lamb wave propagating in a piezoelectric film of a conventional elastic wave device.

FIG. 3A is a schematic front sectional view explaining a Lamb wave propagating in a piezoelectric film of an elastic wave device as described in Japanese Patent Application Laid-Open No. 2012-257019. Here, a wave propagates in a piezoelectric film 201, as indicated by the arrows. Here, in the piezoelectric film 201, a first main surface 201a and a second main surface 201b oppose each other, and a thickness direction connecting the first main surface 201a and the second main surface 201b is the Z direction. The X direction is a direction in which electrode fingers of an IDT electrode are aligned. As shown in FIG. 3A, in the Lamb wave, the wave propagates in the X direction. The wave is a plate wave. Therefore, although the piezoelectric film 201 vibrates as a whole, the wave propagates in the X direction, so that reflectors are provided on both sides to obtain resonance characteristics. Therefore, a wave propagation loss occurs, and the Q value decreases when the size is reduced, that is, when the number of pairs of the electrode fingers is reduced.

Figure 3B:
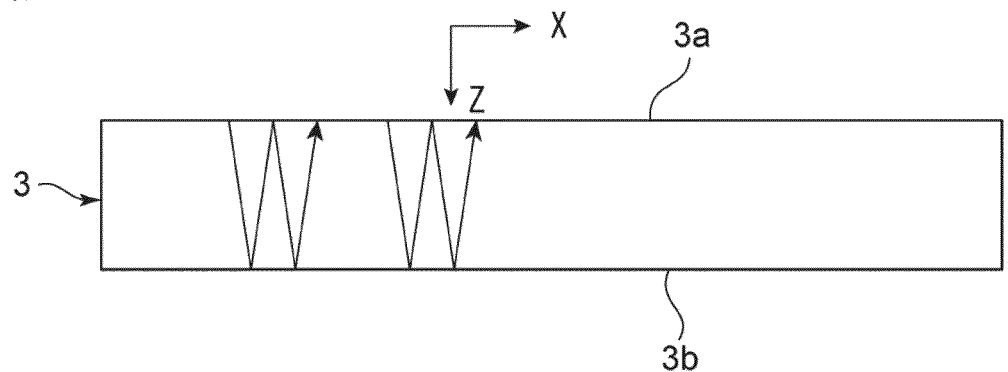
FIG. 3B is a schematic front sectional view explaining a bulk wave in a thickness slip mode propagating in a piezoelectric film in the elastic wave device according to the first preferred embodiment of the present invention.

On the other hand, as shown in FIG. 3B, in the elastic wave device of the present preferred embodiment, the vibration displacement is caused in the thickness sliding direction, so that the wave propagates in or substantially in the direction connecting a first main surfaces 3a and a second main surface 3b of the piezoelectric film 3, that is, in the Z direction and resonates. That is, the X-direction component of the wave is significantly smaller than the Z-direction component. Since the resonance characteristics are obtained by the propagation of the wave in the Z direction, the reflectors are not required. Therefore, there is no propagation loss when the wave propagates to the reflectors. Thus, even if the number of pairs of the electrode pairs including the first and second electrode fingers 13 and 14 is reduced in order to achieve size reduction, the Q value is unlikely to decrease.

Figure 4:
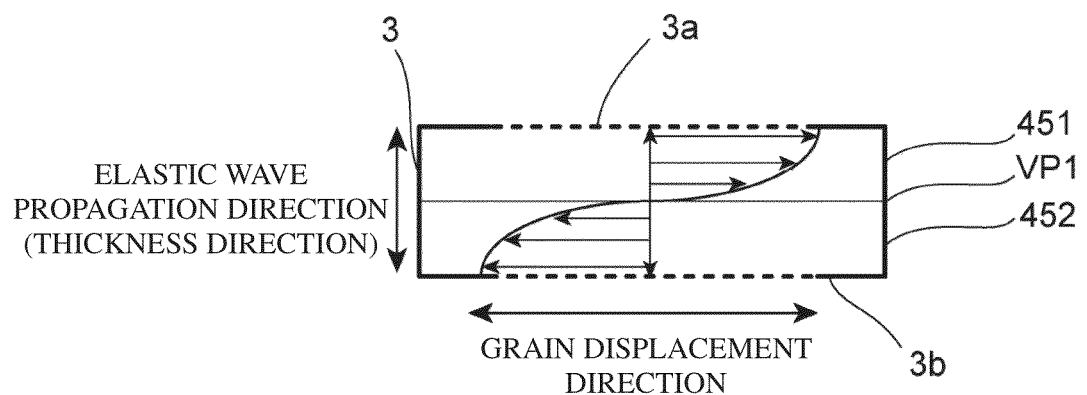
FIG. 4 is a diagram showing an amplitude direction of the bulk wave in the thickness slip mode.

As shown in FIG. 4, the amplitude direction of the bulk wave in the thickness slip mode is opposite between a first region 451 included in the excitation region of the piezoelectric film 3 and a second region 452 included in the excitation region. In FIG. 4, the bulk wave when a voltage that causes the second electrode fingers 14 to have a higher potential than the first electrode fingers 13 is applied between the first electrode fingers 13 and the second electrode fingers 14 is schematically shown. The first region 451 is a region in the excitation region between a virtual plane VP1 that is orthogonal or substantially orthogonal to the thickness direction of the piezoelectric film 3 and divides the piezoelectric film 3 into two, and the first main surface 3a. The second region 452 is a region in the excitation region between the virtual plane VP1 and the second main surface 3b.

As described above, in the elastic wave device 1, at least one pair of electrodes including the first electrode finger 13 and the second electrode finger 14 is provided, but the wave is not propagated in the X direction. Thus, the number of pairs of the electrode pair including the first and second electrode fingers 13 and 14 does not necessarily have to be plural. That is, it is only necessary that at least one pair of electrodes is provided.

For example, the first electrode finger 13 is an electrode connected to a hot potential, and the second electrode finger 14 is an electrode connected to a ground potential. However, the first electrode finger 13 may be connected to the ground potential and the second electrode finger 14 may be connected to the hot potential if so desired. In the present preferred embodiment, at least one pair of electrodes includes an electrode connected to the hot potential and an electrode connected to the ground potential as described above, and a floating electrode is preferably not provided.

Incidentally, when the thickness of the piezoelectric film 3 is d and the distance between the centers of the electrodes of the first electrode finger 13 and the second electrode finger 14 is p, as described above, in the present preferred embodiment, d/p is preferably about 0.5 or less, and more preferably about 0.24 or less, for example. This will be described with reference to FIG. 5.

Figure 5:
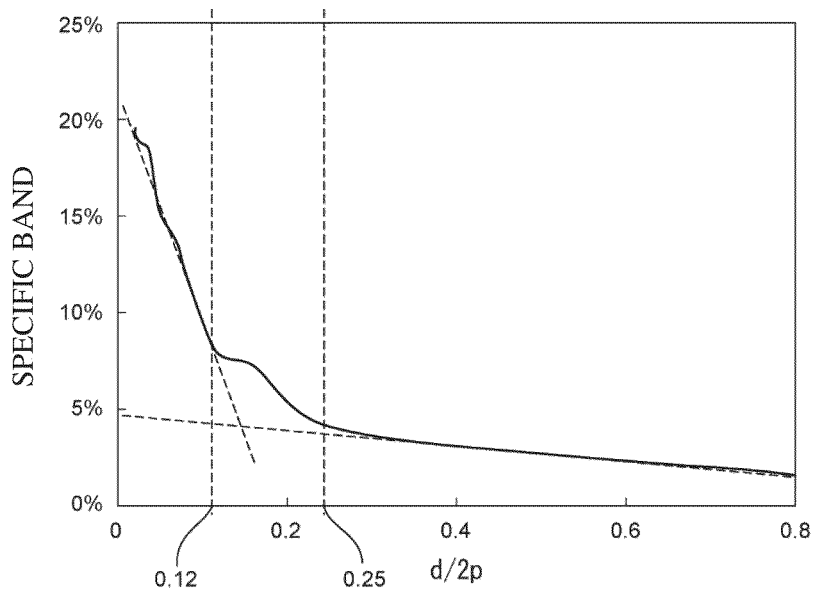
FIG. 5 is a diagram showing the relationship between d/2p and a specific band as a resonator when the distance between the centers of adjacent electrodes or an average distance of distances between the centers of the adjacent electrodes is p and the thickness of the piezoelectric layer is d.

A plurality of elastic wave devices were obtained by changing d/2p. FIG. 5 is a diagram showing the relationship between d/2p and a specific band as a resonator of the elastic wave device.

As is clear from FIG. 5, when d/2p exceeds about 0.25, that is, when d/p > about 0.5, the specific band is less than about 5% even if d/p is adjusted. On the other hand, when d/2p ≤ about 0.25, that is, d/p ≤ about 0.5, the specific band can be set to about 5% or more by changing d/p within that range, that is, a resonator having a high coupling coefficient can be obtained. Further, when d/2p is about 0.12 or less, that is, when d/p is about 0.24 or less, the specific band can be increased to about 7% or more. In addition, if d/p is adjusted within this range, a resonator having a wider specific band can be obtained, and a resonator having a higher coupling coefficient can be obtained. Therefore, it can be seen that by setting d/p to about 0.5 or less, it is possible to provide a resonator having a high coupling coefficient using the bulk wave in the thickness slip mode.

As described above, at least one pair of electrodes may be one pair, and in the case of one pair of electrodes, p is the distance between the centers of the adjacent first and second electrode fingers 13 and 14. In the case of 1.5 pairs or more of electrodes, the average distance of the distances between the centers of the adjacent first and second electrode fingers 13 and 14 may be p.

In the elastic wave device 1, the plurality of first electrode fingers 13 and the plurality of second electrode fingers 14 are provided, but the number of electrode fingers is not particularly limited, and it is only necessary that the elastic wave device 1 includes at least one first electrode finger and at least one second electrode finger.

The piezoelectric film 3 is preferably made of a LiNbO$_3$ film, for example, but lithium tantalate such as, for example, LiTaO$_3$ may be used. The thickness of the piezoelectric film 3 is not particularly limited, but is preferably about 40 nm or more and about 1,000 nm or less, for example. Within this range, the thickness slip mode can be efficiently excited, and good resonance characteristics can be obtained.

Second Preferred Embodiment

Figure 7:
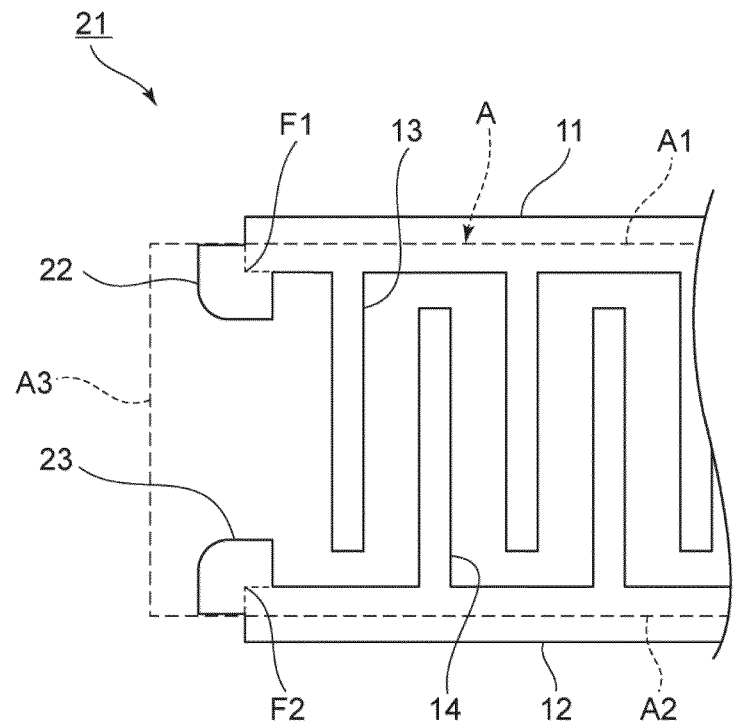
FIG. 7 is a partially cutaway plan view explaining a main portion of an elastic wave device according to a second preferred embodiment of the present invention.

FIG. 7 is a partially cutaway plan view showing a main portion of an elastic wave device according to a second preferred embodiment of the present invention. In an elastic wave device 21, protruding portions 22 and 23 are provided as pressure relaxation portions at one ends of the first bus bar 11 and the second bus bar 12 so as to be connected to corner portions F1 and F2. That is, the corner portions F1 and F2 are corner portions located inside the cavity portion in plan view.

All of the protruding portions 22 and 23 extend from the corner portions F1 and F2 into the cavity portion, particularly in a direction away from the first and second bus bars 11 and 12. Here, "provided so as to extend in a direction away from the first and second bus bars 11 and 12" refers to, for example, a case where at least portions of the protruding portions 22 and 23 are provided in the region opposite to the side of the first and second electrode fingers 13 and 14 with the straight line connecting the corner portion F1 of the first bus bar 11 and the corner portion F2 of the second bus bar 12 interposed between the at least portions of the protruding portions 22 and 23, and the side of the first and second electrode fingers 13 and 14. The protruding portions 22 and 23 are preferably provided between the first and second bus bars 11 and 12 and the outer peripheral edge of the cavity portion, specifically, the third side A3 of the outer peripheral edge where the extending directions of the first and second bus bars 11 and 12 are located. Specifically, the protruding portions 22 and 23 are provided so that portions thereof are in contact with the corner portions F1 and F2 of the first and second bus bars 11 and 12, and the other portions are provided between the first and second bus bars 11 and 12 (corner portions F1 and F2) and the third side A3 of the outer peripheral edge of the cavity portion. In other words, at least portions of the protruding portions 22 and 23 are provided between the first and second bus bars 11 and 12 and the third side A3 of the outer peripheral edge of the cavity portion. By providing the protruding portions 22 and 23 in this way, the concentration of the pressure at the corner portions F1 and F2 of the piezoelectric film 3 can be relaxed, and the occurrence of cracks in the piezoelectric film 3 can be reduced or prevented.

As shown in FIG. 7, curved portions may be provided in the protruding portions 22 and 23 at portions on the outer edge side of the cavity portion. In this case, since the curved shape can be provided to relieve the stress of the most deformable region of the piezoelectric film from the outer edge to the central portion of the cavity portion, it becomes easier to reduce or prevent the occurrence of cracks in the piezoelectric film 3.

Third Preferred Embodiment

Figure 8:
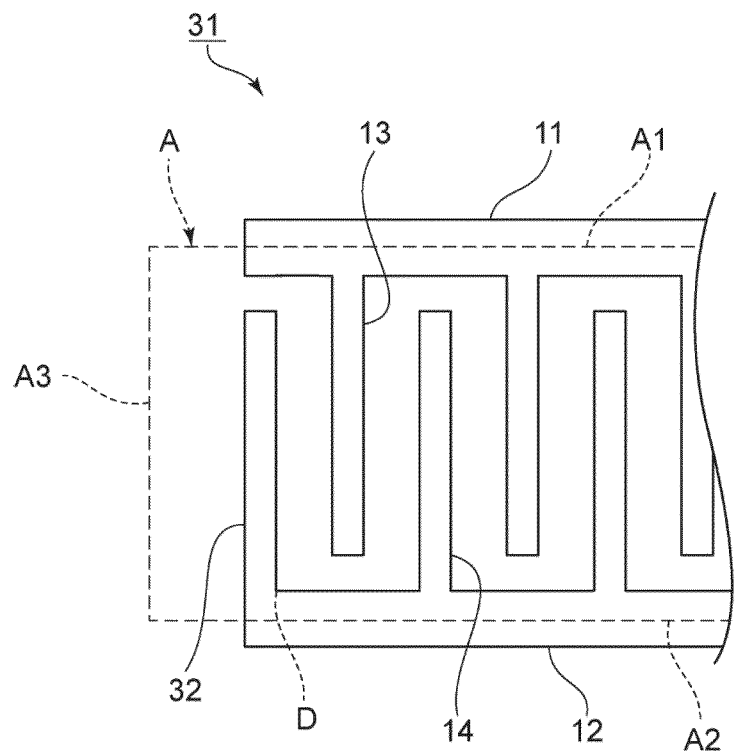
FIG. 8 is a partially cutaway plan view explaining a main portion of an elastic wave device according to a third preferred embodiment of the present invention.

FIG. 8 is a partially cutaway plan view explaining a main portion of an elastic wave device according to a third preferred embodiment of the present invention.

In an elastic wave device 31 of the third preferred embodiment, a protruding portion 32 that also defines and functions as an electrode finger as a pressure relaxation portion is provided on one end side of the second bus bar 12. The protruding portion 32 is formed in the same or substantially the same manner and in the same or substantially the same process as the second electrode finger 14. In the second bus bar 12, the protruding portion 32 as the pressure relaxation portion is connected to a corner portion D on one end side of the second bus bar 12 and includes a portion entering the cavity portion. Therefore, the pressure at the corner portion D is relieved, so that cracks in the piezoelectric film are unlikely to occur.

Fourth and Fifth Preferred Embodiments

Figure 9:
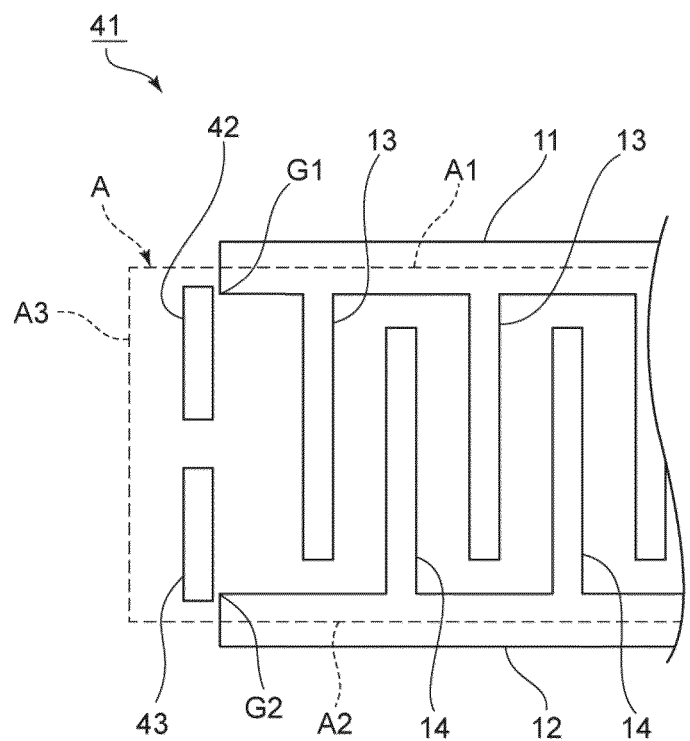
FIG. 9 is a partially cutaway plan view explaining a main portion of an elastic wave device according to a fourth preferred embodiment of the present invention.

FIG. 9 is a partially cutaway plan view explaining a main portion of an elastic wave device according to a fourth preferred embodiment of the present invention.

In an elastic wave device 41, pressure relaxers 42 and 43 are provided on one end sides of the first bus bar 11 and the second bus bar 12. The pressure relaxers 42 and 43 are provided between a corner portion G1 of the first bus bar 11 which enters the cavity portion and the third side A3 of the outer peripheral edge of the cavity portion. Similarly, the pressure relaxer 43 is provided between a corner portion G2 of the second bus bar 12 which is located inside the cavity portion and the third side A3 of the outer peripheral edge of the cavity portion. The pressure relaxers 42 and 43 are made of a metal film in the present preferred embodiment. By providing the pressure relaxers 42 and 43, the pressure concentrated in the corner portion G1 and the corner portion G2 can be relaxed. Therefore, cracks in the piezoelectric film 3 near the corner portions G1 and G2 are unlikely to occur.

The pressure relaxers 42 and 43 can be made of the same or substantially the same metal material as the first and second electrode fingers 13 and 14. In this case, the pressure relaxers 42 and 43 can be provided without increasing the number of steps and materials. However, the pressure relaxers 42 and 43 may be made of other metals if so desired. Further, the pressure relaxers 42 and 43 are not limited to metals, and may be made of ceramics such as, for example, silicon oxide and silicon oxynitride, and resins such as, for example, thermosetting photosensitive polyimide and epoxy.

Figure 10:
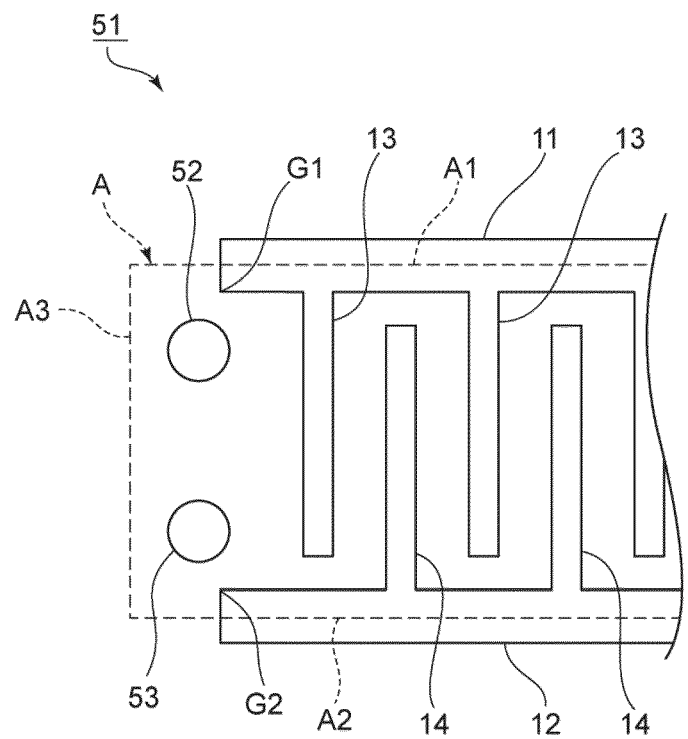
FIG. 10 is a partially cutaway plan view explaining a main portion of an elastic wave device according to a fifth preferred embodiment of the present invention.

Further, the pressure relaxers 42 and 43 preferably have, for example, a rectangular or substantially rectangular shape extending in parallel or substantially in parallel with the direction in which the first and second electrode fingers 13 and 14 extend, but the shape of the pressure relaxers is not limited to this. For example, as in an elastic wave device 51 of a fifth preferred embodiment of the present invention shown in FIG. 10, pressure relaxers 52 and 53 having a circular planar shape may be used.

Further, the pressure relaxers do not necessarily have to be provided independently in the vicinities of the respective first bus bar 11 and second bus bar 12. For example, the pressure relaxer 42 and the pressure relaxer 43 shown in FIG. 9 may be connected and integrated.

Sixth Preferred Embodiment

Figure 11:
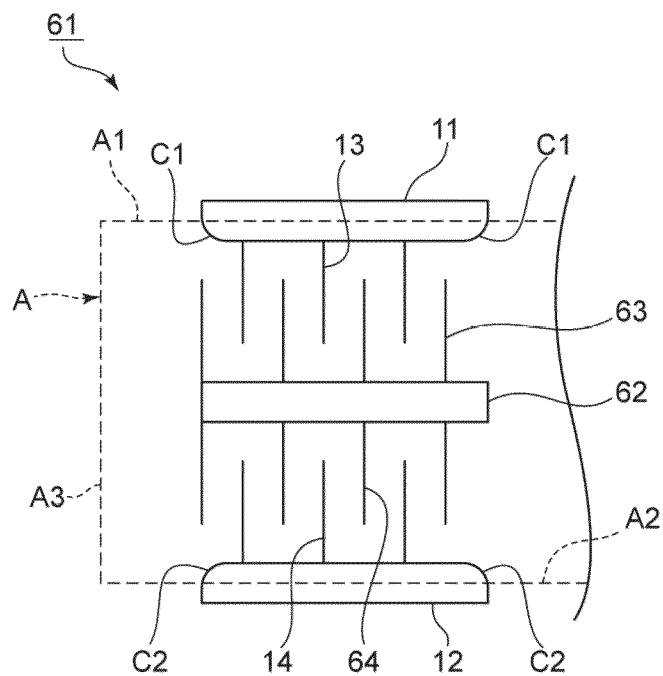
FIG. 11 is a partially cutaway plan view of an elastic wave device according to a sixth preferred embodiment of the present invention.

FIG. 11 is a partially cutaway plan view of an elastic wave device according to a sixth preferred embodiment of the present invention. In an elastic wave device 61, a common bus bar 62 is provided between the first bus bar 11 and the second bus bar 12. The common bus bar 62 is provided with third electrode fingers 63 extending toward the first bus bar 11. The common bus bar 62 is provided with fourth electrode fingers 64 extending toward the second bus bar 12. The elastic wave device 61 may further include such a common bus bar 62 and the third and fourth electrode fingers 63 and 64. In this case, the outer peripheral edge of the cavity portion is shown by the broken line indicated by A.

In the present preferred embodiment, the curved portions C1 and C2 are preferably provided at the corner portions of the first bus bar 11 and the second bus bar 12, which are located inside the cavity portion. That is, since the curved portions C1 and C2 are provided as the pressure relaxation portions, cracks in the piezoelectric film 3 are unlikely to occur as in the first preferred embodiment.

As in the sixth preferred embodiment, the electrode structure of the elastic wave device may further include the third and fourth electrode fingers 63 and 64 and the common bus bar 62 in addition to the first and second bus bars 11 and 12 and the first and second electrode fingers 13 and 14.

As described above, in the first to sixth preferred embodiments, the configuration in which the cavity portion is defined by the recessed portion provided on the first main surface of the support substrate has been disclosed, but the structure of elastic wave devices according to preferred embodiments of the present invention is not limited to this. For example, instead of providing the recessed portion on the first main surface of the support substrate, the cavity portion may be defined by the piezoelectric film becoming convex in the direction away from the first main surface of the support substrate.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An elastic wave device comprising:
   a support substrate including a first main surface and a recessed portion open to the first main surface;
   a piezoelectric film made of lithium niobate or lithium tantalate, laminated on the first main surface of the support substrate, and defining a cavity portion with the recessed portion and the support substrate; and
   an electrode on the piezoelectric film and including first and second bus bars, a first electrode finger connected to the first bus bar, and a second electrode finger connected to the second bus bar; wherein
   the first and second bus bars include a plurality of corner portions located inside the cavity portion when viewed in a plan view;
   the elastic wave device uses a bulk wave in a thickness slip mode; and
   a pressure relaxation portion to relax pressure on the piezoelectric film at at least one of the corner portions of the first and second bus bars is provided between the at least one of the corner portions and an outer edge of the cavity portion.

2. The elastic wave device according to claim 1, wherein the pressure relaxation portion is a curved portion including a curved outer edge at the at least one of the corner portions of the first bus bar and the second bus bar.

3. The elastic wave device according to claim 1, wherein the pressure relaxation portion is a protruding portion that protrudes to an outside of the at least one of the corner portions at the at least one of the corner portions.

4. The elastic wave device according to claim 3, wherein the protruding portion defines and functions as the first or second electrode finger.

5. The elastic wave device according to claim 1, wherein the pressure relaxation portion is a pressure relaxer between the at least one of the corner portions and the outer edge of the cavity portion.

6. An elastic wave device comprising:
   a support substrate including a first main surface and a recessed portion open to the first main surface;
   a piezoelectric film made of lithium niobate or lithium tantalate, laminated on the first main surface of the support substrate, and defining a cavity portion with the recessed portion and the support substrate; and
   an electrode on the piezoelectric film and including first and second bus bars, a first electrode finger connected to the first bus bar, and a second electrode finger connected to the second bus bar; wherein
   the first and second bus bars include a plurality of corner portions inside the cavity portion when viewed in plan view;
   when a thickness of the piezoelectric film is d and a distance between centers of the first electrode finger and second electrode finger is p, d/p is about 0.5 or less; and
   a pressure relaxation portion to relax pressure on the piezoelectric film at at least one of the corner portions of the first and second bus bars is provided between the at least one of the corner portions and an outer edge of the cavity portion.

7. The elastic wave device according to claim 6, wherein the pressure relaxation portion is a curved portion including a curved outer edge at the at least one of the corner portions of the first bus bar and the second bus bar.

8. The elastic wave device according to claim 6, wherein the pressure relaxation portion is a protruding portion that protrudes to an outside of the at least one of the corner portions at the at least one of the corner portions.

9. The elastic wave device according to claim 8, wherein the protruding portion defines and functions as the first or second electrode finger.

10. An elastic wave device comprising:
    a support substrate including a first main surface and a recessed portion open to the first main surface;
    a piezoelectric film laminated on the first main surface of the support substrate and defining a cavity portion with the recessed portion and the support substrate; and
    an electrode on the piezoelectric film and including first and second bus bars, a first electrode finger connected to the first bus bar, and a second electrode finger connected to the second bus bar; wherein
    the first and second bus bars include corner portions located inside the cavity portion when the support substrate and the piezoelectric film are viewed in a laminating direction in plan view; and
    at least a portion of an outer edge of at least one of the corner portions of the first and second bus bars has a curved shape.

11. The elastic wave device according to claim 10, wherein the piezoelectric film is made of lithium niobate or lithium tantalate.

12. The elastic wave device according to claim 11, wherein the elastic wave device uses a bulk wave in a thickness slip mode.

13. The elastic wave device according to claim 11, wherein, when a thickness of the piezoelectric film is d and a distance between centers of the first electrode finger and second electrode finger is p, d/p is about 0.5 or less.

14. An elastic wave device comprising:
- a support substrate including a first main surface and a recessed portion open to the first main surface;
- a piezoelectric film laminated on the first main surface of the support substrate and defining a cavity portion with the recessed portion and the support substrate; and
- an electrode on the piezoelectric film and including first and second bus bars, a first electrode finger connected to the first bus bar, and a second electrode finger connected to the second bus bar; wherein
- the first and second bus bars include corner portions located inside the cavity portion when the support substrate and the piezoelectric film are viewed in a laminating direction in plan view; and
- a portion extending in a direction away from the first or second bus bar is provided at at least one of the corner portions of the first and second bus bars, or between the at least one of the corner portions and an outer edge of the cavity portion.

15. The elastic wave device according to claim 14, wherein the portion is a protruding portion that protrudes to an outside of the at least one of the corner portions at the at least one of the corner portions.

16. The elastic wave device according to claim 14, wherein the portion is between the at least one of the corner portions and the outer edge of the cavity portion.

17. The elastic wave device according to claim 15, wherein a curved portion is provided at a portion of the protruding portion on the outer edge side of the cavity portion.

18. The elastic wave device according to claim 16, wherein the portion has a circular planar shape.

19. The elastic wave device according to claim 16, wherein a plurality of the portions are provided.

20. The elastic wave device according to claim 19, wherein, of the plurality of portions, a first portion is at a portion closer to the first bus bar than to the second bus bar, and a second portion is at a portion closer to the second bus bar than to the first bus bar.

* * * * *